United States Patent
Liu

(10) Patent No.: US 7,313,063 B2
(45) Date of Patent: Dec. 25, 2007

(54) METHOD OF DETERMINING THE TIME FOR EXECUTING OPTIMAL POWER CALIBRATION IN AN OPTICAL DRIVE

(75) Inventor: Chi-Yuan Liu, Taipei (TW)

(73) Assignee: Lite-On It Corporation, Neihu, Taipei (TW)

(*) Notice: Subject to any disclaimer, the term of this patent is extended or adjusted under 35 U.S.C. 154(b) by 449 days.

(21) Appl. No.: 10/711,779

(22) Filed: Oct. 4, 2004

(65) Prior Publication Data

US 2005/0089071 A1  Apr. 28, 2005

(30) Foreign Application Priority Data

Oct. 24, 2003  (TW) .............................. 92129679 A

(51) Int. Cl.
*G11B 7/00* (2006.01)
(52) U.S. Cl. ................................. 369/47.53; 369/47.28
(58) Field of Classification Search ..................... None
See application file for complete search history.

(56) References Cited

U.S. PATENT DOCUMENTS

| | | | | |
|---|---|---|---|---|
| 5,274,622 A | * | 12/1993 | Kono | 369/116 |
| 5,675,568 A | * | 10/1997 | Hajjar et al. | 369/47.51 |
| 5,796,704 A | * | 8/1998 | Nanba et al. | 369/53.12 |
| 5,878,015 A | * | 3/1999 | Schell et al. | 369/116 |
| 6,331,966 B1 | * | 12/2001 | Minami et al. | 369/13.07 |
| 6,671,232 B1 | * | 12/2003 | Stupp | 369/13.02 |
| 6,741,529 B1 | * | 5/2004 | Getreuer | 369/30.17 |
| 6,901,039 B1 | * | 5/2005 | Sugie et al. | 369/47.28 |
| 6,996,381 B2 | * | 2/2006 | Lee | 455/115.1 |
| 7,126,896 B2 | * | 10/2006 | Miyaki | 369/47.53 |
| 2003/0169659 A1 | * | 9/2003 | Miyaki | 369/47.53 |

* cited by examiner

*Primary Examiner*—Wayne Young
*Assistant Examiner*—Van T. Pham
(74) *Attorney, Agent, or Firm*—Winston Hsu

(57) ABSTRACT

A method of determining the time for executing optimal power calibration in an optical drive. First, relationships between values of a driving signal and ambient temperatures of the optical drive are recorded in look up table in a memory. According to the look up table, mappings from the values of a driving signal output by a compensator to the ambient temperature of the optical drive can be obtained. When the ambient temperature of the optical drive is higher than a predetermined temperature, an optimal power calibration is executed.

7 Claims, 5 Drawing Sheets

US 7,313,063 B2

METHOD OF DETERMINING THE TIME FOR EXECUTING OPTIMAL POWER CALIBRATION IN AN OPTICAL DRIVE

BACKGROUND OF INVENTION

1. Field of the Invention

The present invention relates to a method of power calibration of a laser diode in an optical drive, and more particularly, to a method of determining the time for executing optimal power calibration in an optical drive.

2. Description of the Prior Art

A laser diode of an optical pickup head is a light source for accessing an optical disc. When the optical drive performs a write operation, the power of the laser diode must be higher and more stable than when performing a read operation. Please refer to FIG. 1, which is a diagram of a closed loop control circuit for controlling the power of the laser diode. First, a digital to analog converter (DAC) 10 transforms a digital control signal 12 into an analog control signal 14. An error signal 16 generated by subtracting a feedback signal 42 from the analog control signal 14 is input into a compensator 20. The compensator 20 generates and transmits a driving signal 22 to an amplifier 25 according to the error signal 16. Next, the amplifier 25 transforms the driving signal 22 into a driving current 28 transmitted to a laser diode (LD) 30. The laser diode 30 emits a laser beam 32 according to the driving current 28. After the laser beam 32 is received by a front monitor diode (FMD) 40, the front monitor diode outputs the feedback signal 42.

Generally, there is a temperature sensor set in the optical pickup head of the optical drive, not shown in FIG. 1, such as a thermistor. The temperature sensor is utilized for monitoring the ambient temperature of the optical pickup head. However, when the optical drive performs a write operation on the optical disc, the ambient temperature of the pickup head has a great influence on the writing quality of the optical disc. In other words, the same power of the laser diode 30 used for writing to the optical disc in conditions with different temperatures results in different effects.

Therefore, when the temperature inside the optical drive changes, the optical pickup head must execute an optimal power calibration (OPC). The optimal power calibration is performed after the temperature inside the optical drive changes. The optical drive uses a different writing power to perform the write operation on the optical disc. Otherwise, when the temperature inside the optical drive changes, if the writing power of the laser diode is not changed, the writing quality of the optical disc might reduce, or the optical pickup head might fail to perform the write operation.

However, in order to decrease the cost of the optical drive, there is no temperature sensor for optical pickup heads of special optical drives. Thus, how to determine the time for executing the optical power calibration is an important issue to avoid reducing the writing quality of the optical disc or failing to write the optical disc when performing a write operation on the optical disc.

SUMMARY OF INVENTION

It is therefore a primary objective of the claimed invention to provide a method of determining the time for executing optimal power calibration in an optical drive to solve the above-mentioned problem. If an optical pickup head does not include a temperature sensor, the ambient temperature inside the optical drive is obtained by a driving signal of a compensator. Then the optimal power calibration is executed when the ambient temperature reaches a predetermined temperature.

The claimed invention provides a method of determining the time for executing optimal power calibration in an optical drive applied to a closed loop control circuit of a laser diode output power. The method includes receiving a driving signal output from a compensator, transforming the driving signal to a driving signal value by an analog to digital converter (ADC), transforming the driving signal value to a temperature value according to a look up table, and executing the optimal power calibration when the temperature value is higher than a predetermined temperature.

The claimed invention provides a method of determining the time of executing optimal power calibration in an optical drive applied to a closed loop control circuit of a laser diode output power. The method includes receiving a driving signal output from a compensator, transforming the driving signal to a driving signal value by an analog to digital converter (ADC), and executing the optimal power calibration when the driving signal value is higher than a driving signal threshold value.

These and other objectives of the present invention will no doubt become obvious to those of ordinary skill in the art after reading the following detailed description of the preferred embodiment that is illustrated in the various figures and drawings.

DETAILED DESCRIPTION

The output power of a laser diode inside an optical drive is controlled by a digital control signal changed by firmware. The digital control signal is transformed into an analog control signal by a digital to analog converter (DAC). Next, a compensator and an amplifier generate a driving current to drive the laser diode to output a predetermined power. Of course, in order to retain the constant output power of the laser diode, a front monitor diode is used for receiving the laser beam output from the laser diode to generate a feedback signal achieving the purpose of the closed loop circuit.

Generally, the output power of the laser diode is decreased with increasing temperatures inside the optical drive. Therefore, a closed loop circuit controls the output power of the laser diode. A compensator changes the driving signal according to an error signal so that the laser diode can output a stable and assigned output power conforming to the digital signal. That is, the driving signal output from the compensator increases with the increasing temperature to make the output power of the laser diode stable.

Figure 1:
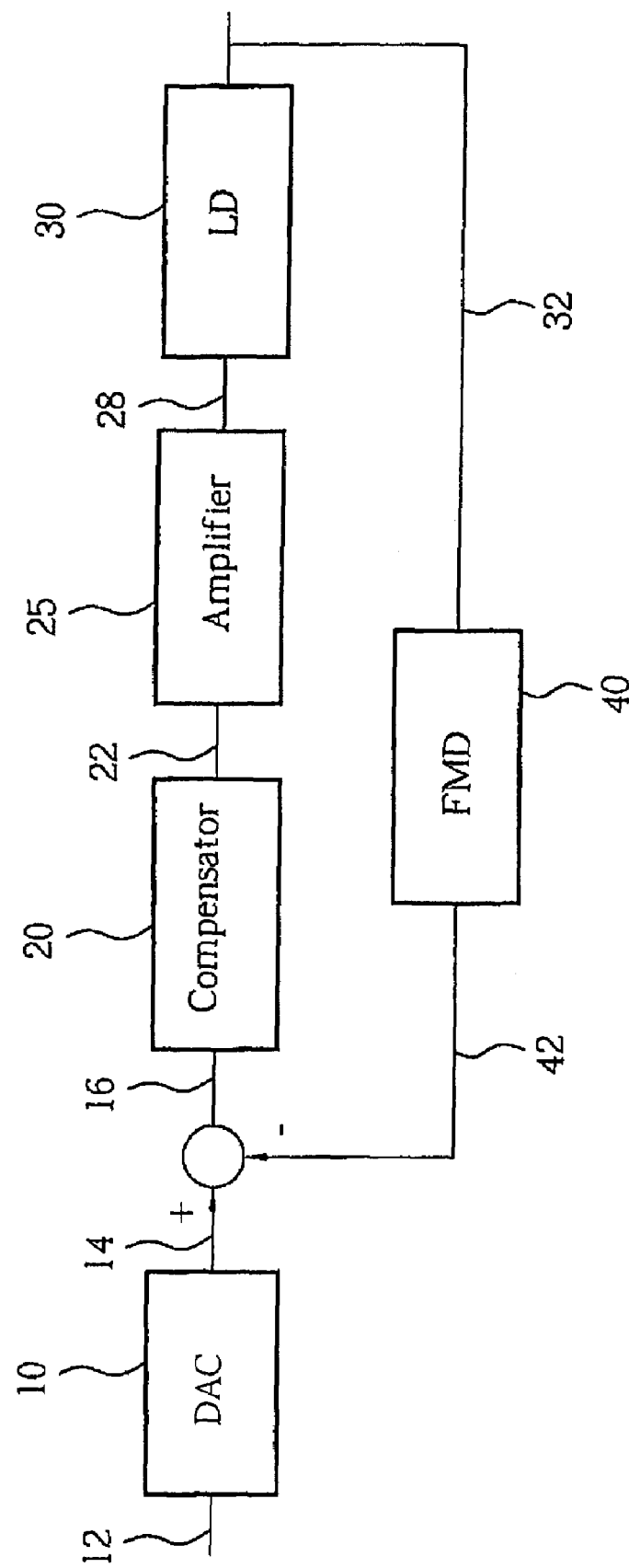
FIG. 1 is a diagram of a conventional closed loop control circuit for controlling the power of a laser diode.
Figure 2:
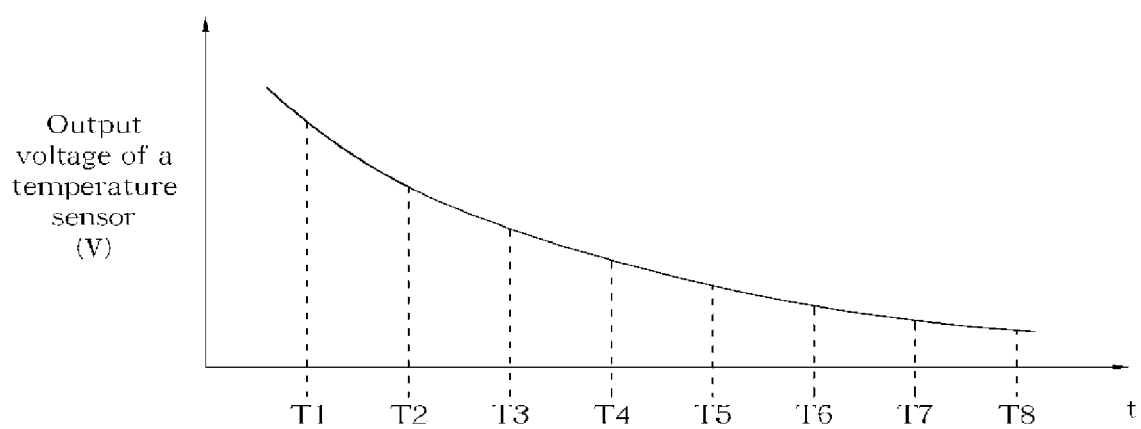
FIG. 2 is a diagram of output voltage of a temperature sensor versus time.
Figure 3:
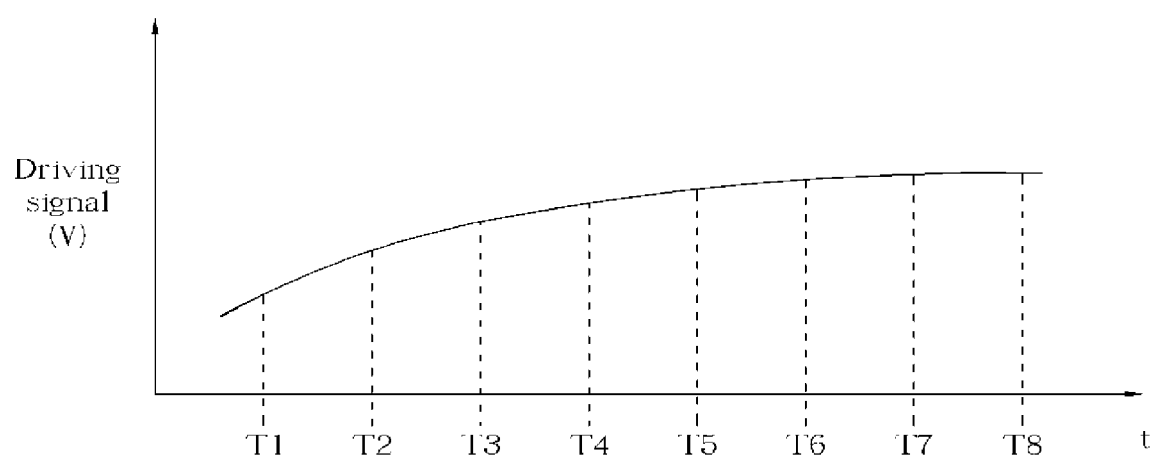
FIG. 3 is a diagram of output voltage of a driving signal versus time.

Please FIG. 2 and FIG. 3. FIG. 2 is a diagram of the output voltage of the temperature sensor versus time. FIG. 3 is a diagram of the output voltage of the driving signal versus time. When the optical drive performs a write operation, the temperature inside the optical drive increases gradually.

Therefore, according to the properties of the temperature sensor (thermistor), the output voltage is decreased with increasing temperatures. The temperature inside the optical drive is obtained by this property. Moreover, the driving signal output from the compensator is also increased with the increasing temperature. Therefore, the relationship of the driving signal and the temperature (T1~T8) is obtained according to FIG. 2 and FIG. 3.

According to the relationship of the driving signal and the temperature mentioned above, a look up table is made and stored in a read only memory (ROM) in the optical drive. The values of driving signals corresponding to temperatures are recorded in the look up table. The values of driving signals are obtained by the driving signal of the compensator received by the ADC. Hence, the temperature sensor is not needed to get the temperature inside the optical drive. On the contrary, the temperature inside the optical drive can be obtained by detecting the values of driving signals and the look up table.

Figure 4:
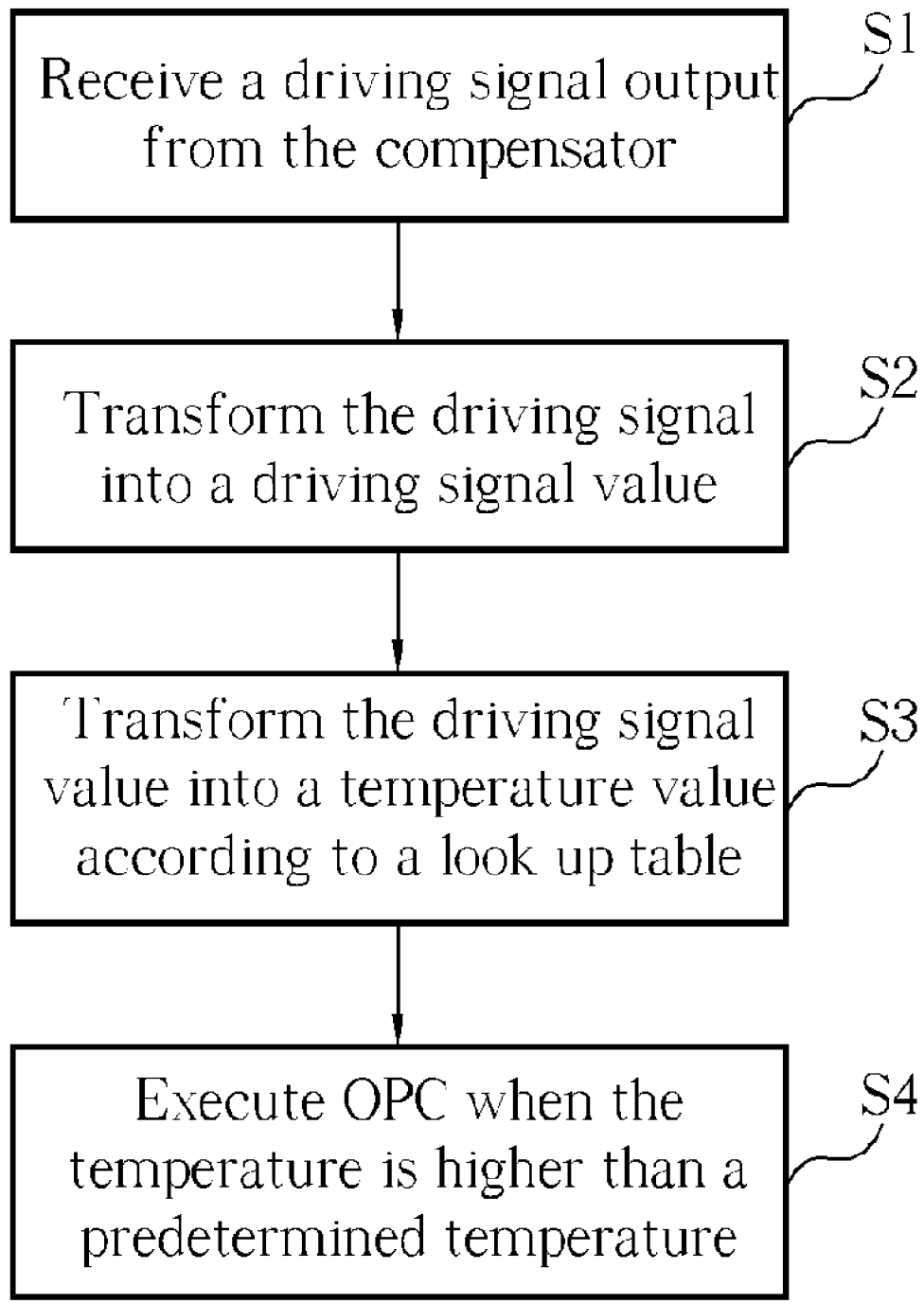
FIG. 4 is a flowchart for determining the time of executing the optimal power calibration.

Please refer to FIG. 4. FIG. 4 is a flowchart for determining the time of executing the optimal power calibration.

Step S1: Receive a driving signal from the compensator.

Step S2: Transform the driving signal into a driving signal value.

Step S3: Transform the driving signal value into a temperature value according to a look up table.

Step S4: Execute the optimal power calibration when the temperature value is higher than a predetermined temperature.

Figure 5:
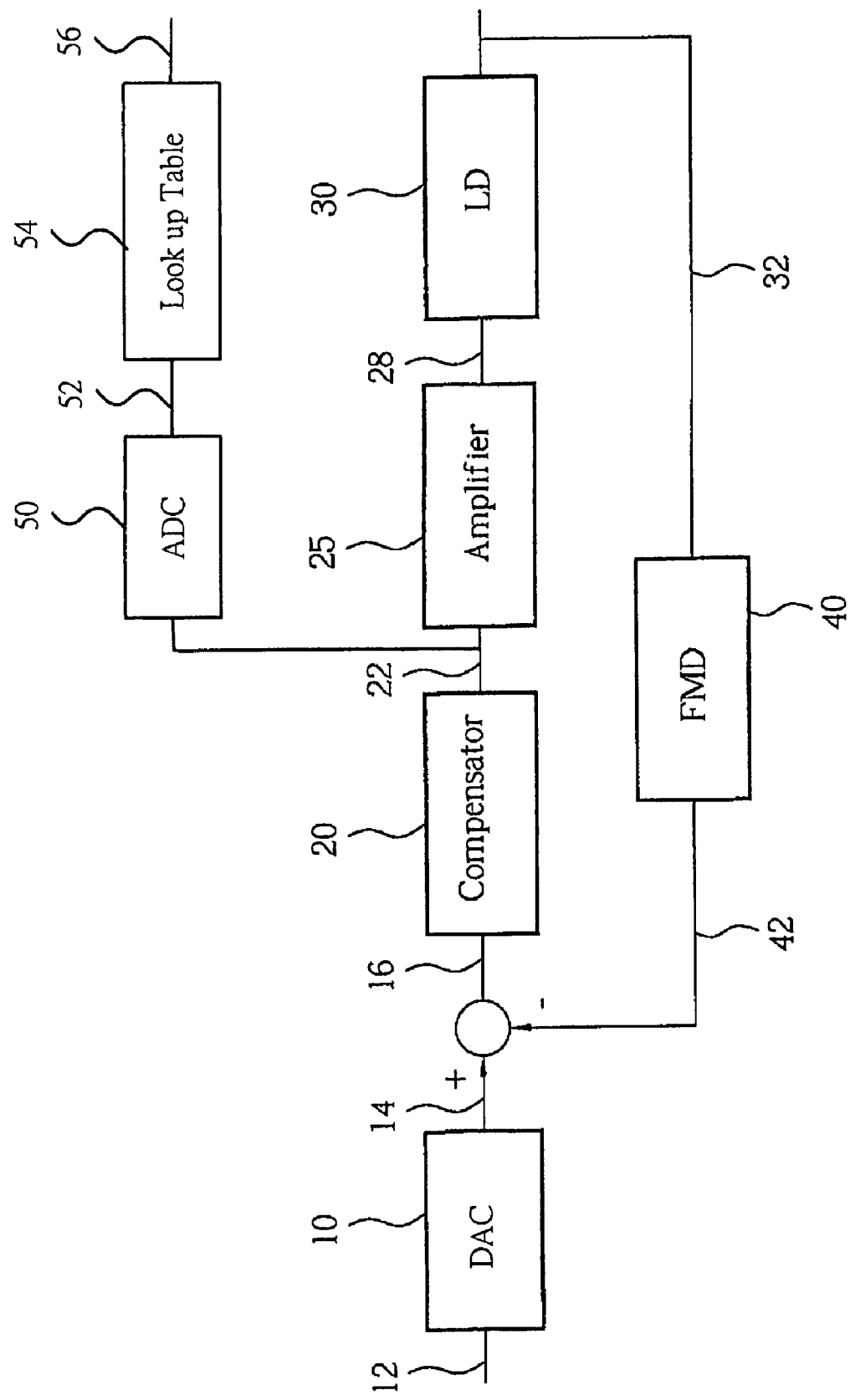
FIG. 5 is a diagram of the control circuit of the present invention.

According to the above-described method, FIG. 5 shows the diagram of the control circuit of the present invention. First, a digital to analog converter (DAC) 10 transforms a digital control signal 12 into an analog control signal 14. An error signal 16 generated by subtracting a feedback signal 42 from the analog control signal 14 is input into a compensator 20. The compensator 20 generates and transmits a driving signal 22 to an amplifier 25 according to the error signal 16. Next, the amplifier 25 transforms the driving signal 22 into a driving current 28 transmitted to a laser diode (LD) 30. The laser diode 30 emits a laser beam 32 according to the driving current 28. After the laser beam 32 is received by a front monitor diode (FMD) 40, the front monitor diode outputs the feedback signal 42. Furthermore, an analog to digital converter (ADC) 50 receives the driving signal 22 from the compensator 20 and transforms the driving signal 22 to a driving signal value 52. A look up table 54, which stores the relationship of the driving signal and the temperature, generates a temperature value 56 according to the received driving signal value 52.

According to the steps mentioned above, the present invention uses the look up table stored in the memory and records the values of driving signals to find out the temperature inside the optical drive for executing the optimal power calibration. Then, when the temperature of the optical drive is higher than a predetermined temperature, the optimal power calibration is executed.

Furthermore, the present invention can record a driving signal threshold value stored in the ROM. When the driving signal value is higher than the driving signal threshold value; that is, the temperature inside the optical drive is higher than a predetermined temperature and therefore too high, the optical drive must perform the optimal power calibration.

The present invention provides a method of determining the time of executing optimal power calibration in an optical drive. Although there is no temperature sensor set in the optical pickup head, the temperature inside the optical drive can still be obtained by the present invention and then execute the optimal power calibration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of determining the time for executing optimal power calibration applied in a closed loop control circuit of a laser diode in an optical drive, the method comprising:
   receiving a driving signal output from a compensator;
   transforming the driving signal to a driving signal value by an analog to digital converter;
   transforming the driving signal value to a temperature value according to a look up table; and
   executing the optimal power calibration when the temperature value is higher than a predetermined temperature.

2. The method of claim 1 wherein relationships between the driving signal value and the temperature value are recorded in the look up table.

3. The method of claim 1 wherein the look up table is stored in a read only memory.

4. The method of claim 1 further comprising:
   transforming a digital control signal to an analog control signal by a digital to analog circuit;
   the compensator receiving a difference of the analog control signal and a feedback signal to generate the driving signal;
   an amplifier receiving the driving signal and outputting a driving current;
   the laser diode receiving the driving current and generating a laser beam; and
   a front monitor diode receiving the laser beam to generate the feedback signal.

5. A method of determining the time for executing optimal power calibration applied to a closed loop control circuit of a laser diode in an optical drive, the method comprising:
   receiving a driving signal output from a compensator;
   transforming the driving signal to a driving signal value by an analog to digital converter; and
   executing the optimal power calibration when the driving signal value is higher than a driving signal threshold value.

6. The method of claim 5 wherein the driving signal threshold value is stored in a read only memory.

7. The method of claim 5 further comprising:
   transforming a digital control signal to an analog control signal by a digital to analog circuit;
   the compensator receiving a difference of the analog control signal and a feedback signal to generate the driving signal;
   an amplifier receiving the driving signal and outputting a driving current;
   the laser diode receiving the driving current and generating a laser beam; and
   a front monitor diode receiving the laser beam to generate the feedback signal.

* * * * *